United States Patent
Zuo et al.

(12)

(10) Patent No.: US 10,412,859 B1
(45) Date of Patent: Sep. 10, 2019

(54) STORAGE DEVICE CARRIER SYSTEM

(71) Applicant: EMC IP Holding Company, LLC, Hopkinton, MA (US)

(72) Inventors: Weidong Zuo, Shrewsbury, MA (US); Hao Zhou, Shanghai (CN); Qingqiang Guo, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/656,670

(22) Filed: Jul. 21, 2017

(51) Int. Cl.
*G06F 1/16* (2006.01)
*H05K 7/20* (2006.01)

(52) U.S. Cl.
CPC .............................. *H05K 7/20727* (2013.01)

(58) Field of Classification Search
CPC ............ G06F 1/16; G06F 1/181; G06F 1/206; H05K 7/20727; H05K 5/00; H05K 7/00; H05K 7/20836; H05K 7/20145; H05K 7/20736; H05K 7/20; H05K 7/20572; H05K 7/20754; H05K 7/20209; H05K 7/20818; H05K 9/0041

USPC ..................... 361/679.49, 679.33–679.39
See application file for complete search history.

(56) References Cited

U.S. PATENT DOCUMENTS

| | | | | |
|---|---|---|---|---|
| 9,363,926 | B1 * | 6/2016 | Beall ................. | H05K 7/20736 |
| 9,936,611 | B1 * | 4/2018 | Beall ................. | H05K 7/20736 |
| 2011/0229749 | A1 * | 9/2011 | Kim .................. | H01M 10/486 |
| | | | | 429/120 |
| 2014/0204537 | A1 * | 7/2014 | Rust .................. | G11B 33/128 |
| | | | | 361/727 |
| 2015/0062799 | A1 * | 3/2015 | Wei ................... | H05K 7/20736 |
| | | | | 361/679.33 |
| 2018/0070475 | A1 * | 3/2018 | Ross ................. | H05K 7/20836 |

* cited by examiner

*Primary Examiner* — Mandeep S Buttar
(74) *Attorney, Agent, or Firm* — Brian J. Colandreo; Mark H. Whittenberger; Holland & Knight LLP

(57) ABSTRACT

A storage device carrier system includes a linear array of mounting trays, wherein each mounting tray is configured to removeably receive a storage device. A velocity-increasing longitudinal cooling channel is configured to provide cooling air to the linear array of mounting trays.

20 Claims, 4 Drawing Sheets

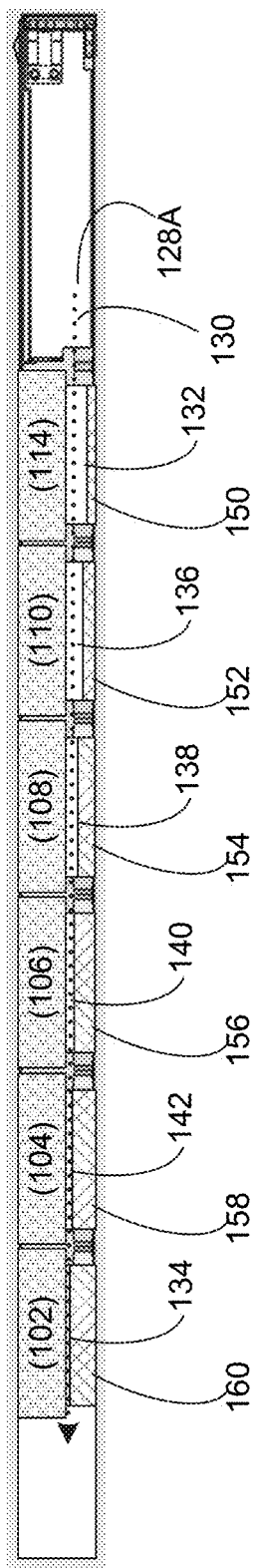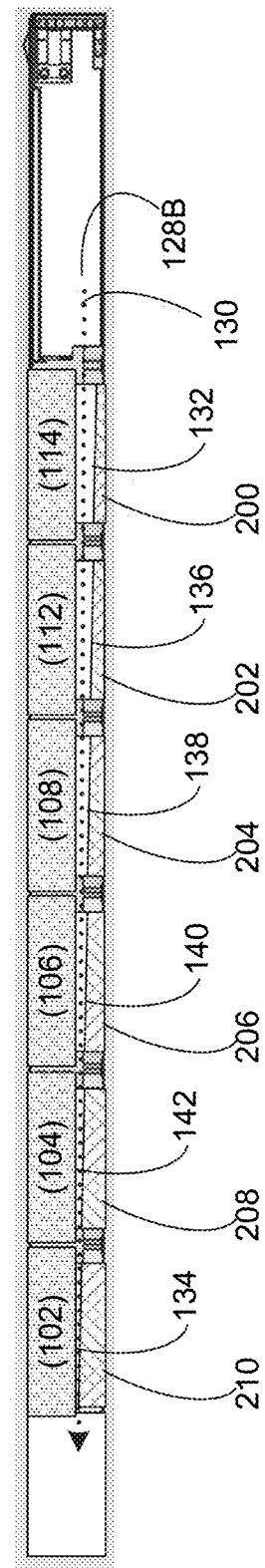

STORAGE DEVICE CARRIER SYSTEM

TECHNICAL FIELD

This disclosure relates to storage device carriers and, more particularly, to storage device carriers that provide enhanced cooling.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, the various IT components mounted within IT racks consume considerable power and, therefore, produce considerable heat. Accordingly, these various IT component need to be provided with ample cooling in order to avoid heat-related failures.

SUMMARY OF DISCLOSURE

In one implementation, a storage device carrier system includes a linear array of mounting trays, wherein each mounting tray is configured to removeably receive a storage device. A velocity-increasing longitudinal cooling channel is configured to provide cooling air to the linear array of mounting trays.

One or more of the following features may be included. The velocity-increasing longitudinal cooling channel may include a beginning portion and an ending portion. The beginning portion may be configured to receive the cooling air. The beginning portion may have a beginning cross-sectional area and the ending portion may have an ending cross-sectional area that is smaller than the beginning cross-sectional area. The velocity-increasing longitudinal cooling channel may include at least one intermediate portion that is positioned between the beginning portion and the ending portion. The at least one intermediate portion may have a cross-sectional area that is smaller than the beginning cross-sectional area but larger than the ending cross-sectional area. The at least one intermediate portion may include four intermediate portions. The four intermediate portions may include: a first intermediate portion positioned proximate the beginning portion; a second intermediate portion positioned proximate the first intermediate portion; a third intermediate portion positioned proximate the second intermediate portion; and a fourth intermediate portion positioned between the third intermediate portion and the ending portion. The velocity-increasing longitudinal cooling channel may be a stepped, velocity-increasing longitudinal cooling channel. The stepped, velocity-increasing longitudinal cooling channel may include one or more spacer assemblies configured to reduce the cross-sectional area of the portions of the stepped, velocity-increasing longitudinal cooling channel as the cooling air moves from the beginning portion to the ending portion of the stepped, velocity-increasing longitudinal cooling channel. The velocity-increasing longitudinal cooling channel may be a sloped, velocity-increasing longitudinal cooling channel. The sloped, velocity-increasing longitudinal cooling channel may include at least one sloped surface configured to reduce the cross-sectional area of the portions of the sloped, velocity-increasing longitudinal cooling channel as the cooling air moves from the beginning portion to the ending portion of the sloped, velocity-increasing longitudinal cooling channel. The storage device may be a solid state storage device. The storage device may be an electro-mechanical storage device.

In another implementation, a storage device carrier system includes a linear array of mounting trays, wherein each mounting tray is configured to removeably receive a storage device. A velocity-increasing longitudinal cooling channel is configured to provide cooling air to the linear array of mounting trays and includes a beginning portion and an ending portion. The beginning portion has a beginning cross-sectional area and is configured to receive the cooling air. The ending portion has an ending cross-sectional area that is smaller than the beginning cross-sectional area.

One or more of the following features may be included. The velocity-increasing longitudinal cooling channel may include at least one intermediate portion that is positioned between the beginning portion and the ending portion. The at least one intermediate portion may have a cross-sectional area that is smaller than the beginning cross-sectional area but larger than the ending cross-sectional area.

In another implementation, a storage device carrier system includes a linear array of mounting trays, wherein each mounting tray is configured to removeably receive a storage device. A stepped, velocity-increasing longitudinal cooling channel is configured to provide cooling air to the linear array of mounting trays and includes: a beginning portion having a beginning cross-sectional area and configured to receive the cooling air, an ending portion having an ending cross-sectional area that is smaller than the beginning cross-sectional area, and one or more spacer assemblies configured to reduce the cross-sectional area of the portions of the stepped, velocity-increasing longitudinal cooling channel as the cooling air moves from the beginning portion to the ending portion of the stepped, velocity-increasing longitudinal cooling channel.

One or more of the following features may be included. The velocity-increasing longitudinal cooling channel may include at least one intermediate portion that is positioned between the beginning portion and the ending portion. The at least one intermediate portion may have a cross-sectional area that is smaller than the beginning cross-sectional area but larger than the ending cross-sectional area.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2; and FIGS. 3-5 are diagrammatic views of a storage device carrier system according to an aspect of this invention.

Like reference symbols in the various drawings indicate like elements.

DETAILED DESCRIPTION OF THE PREFERRED EMBODIMENTS

Figure 1:
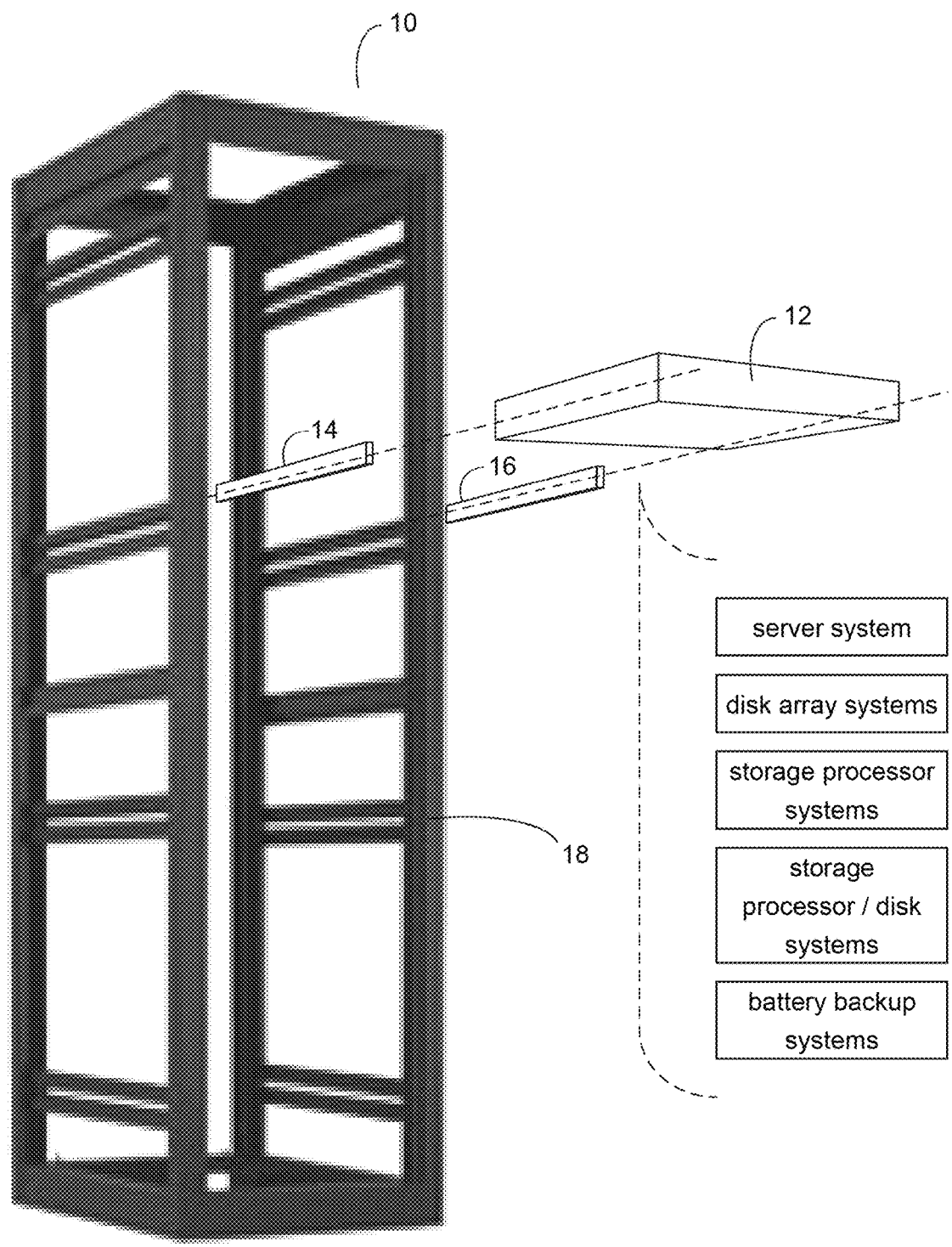
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
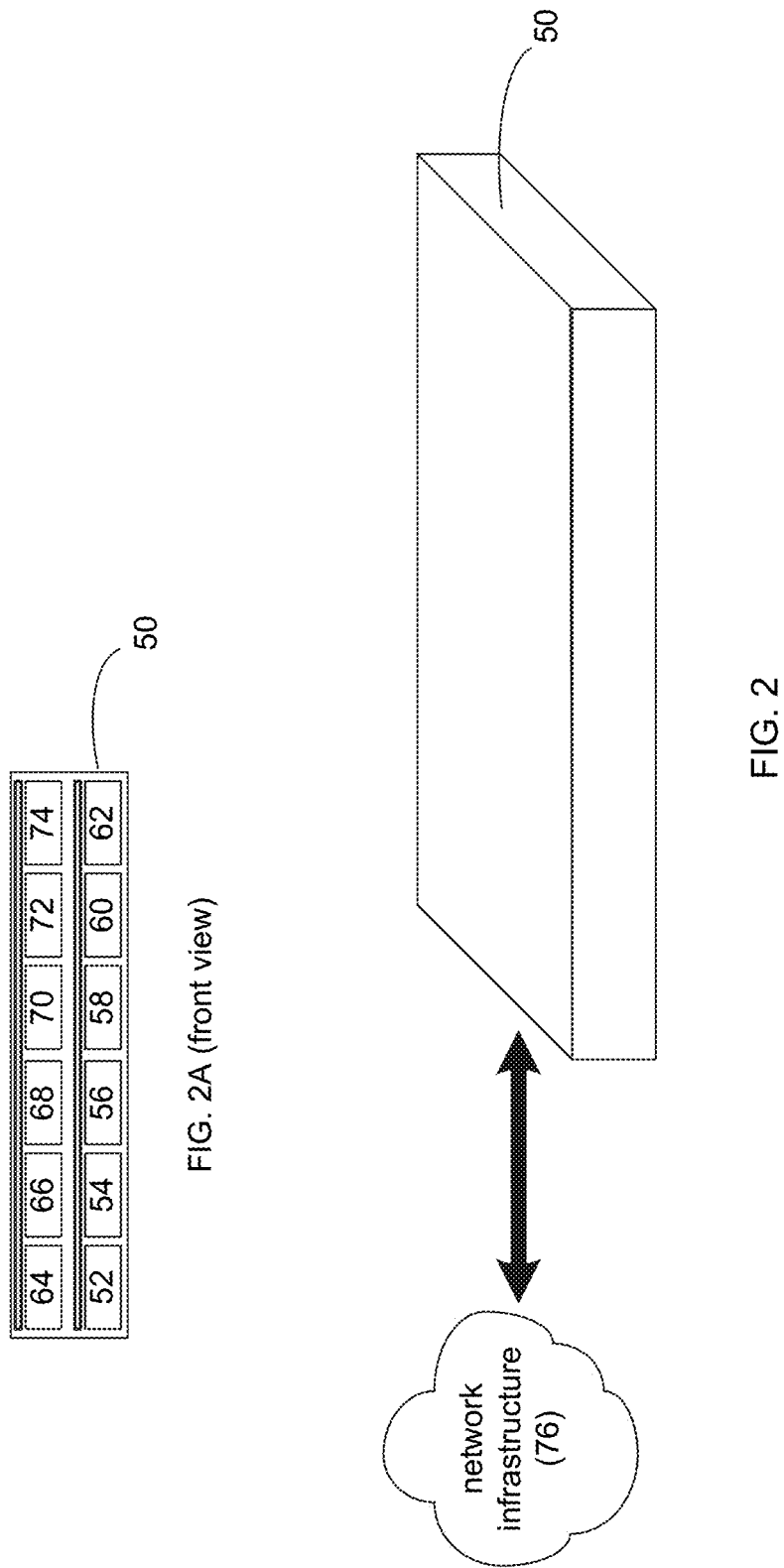
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more electro-mechanical (e.g., rotating-media) storage devices (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74) that are accessible through the front panel of rack-mountable computing device 50.

Input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

Processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

As the capabilities of rack-mountable computing device 50 continue to increase, the power consumption of rack-mountable computing device 50 may also continue to increase. And, therefore, the heat generated by rack-mountable computing device 50 may also continue to increase. Accordingly, enhanced methods of cooling rack-mountable computing device 50 may be needed to avoid heat-related component failure.

Figure 3:
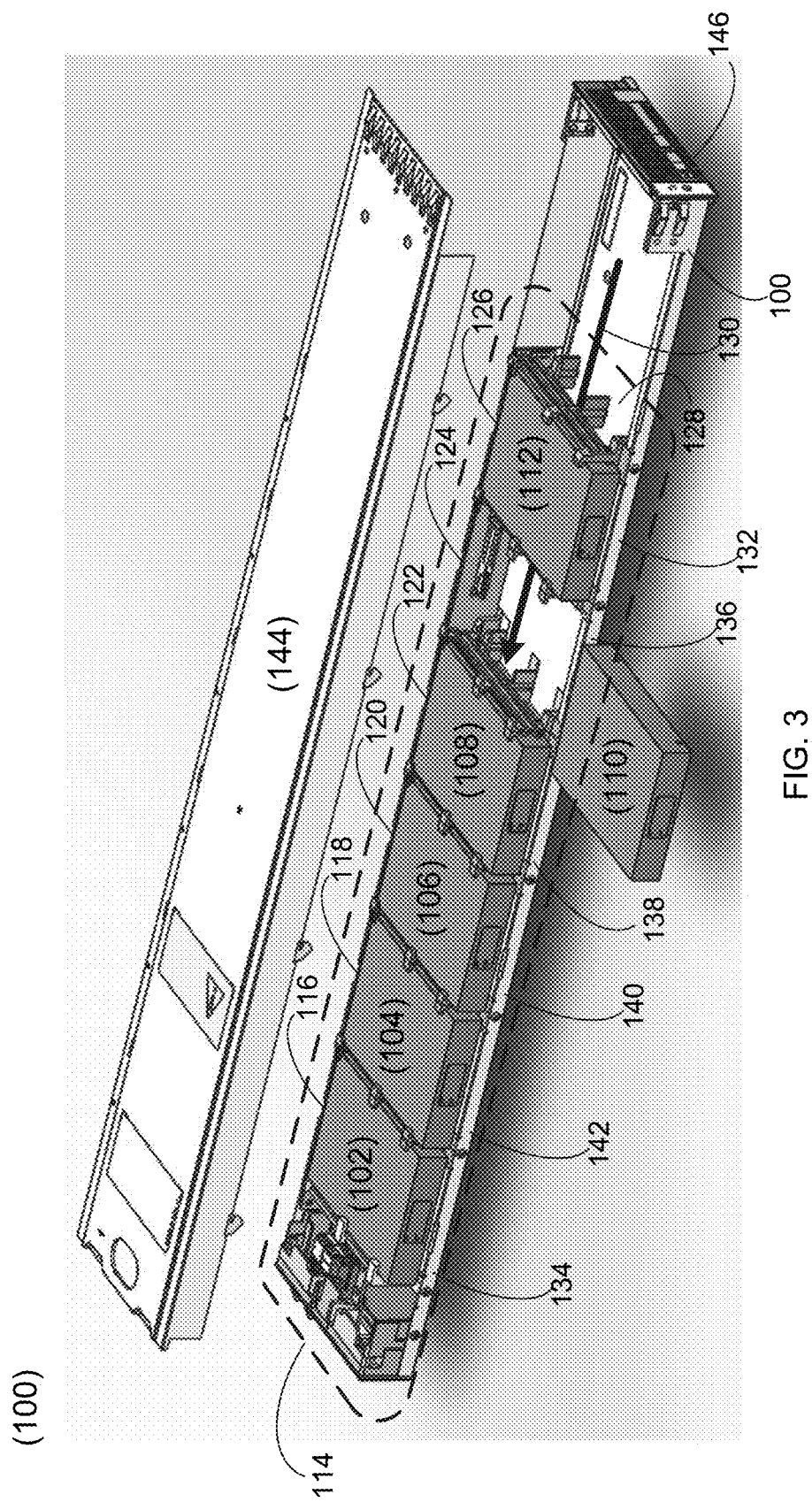

For example and referring also to FIG. 3, there is shown one implementation of storage device carrier system 100. While the following discussion concerns storage device carrier system 100 being utilized within rack-mountable computing device 50, this is for illustrative purposes only and is not intended to be a limitation of this disclosure, as other configurations are possible and are considered to be within the scope of this disclosure. For example, storage device carrier system 100 may be utilized within commercial-grade, non-rack-mountable computing devices or consumer-grade computing devices.

Storage device carrier system 100 may be configured to house a plurality of storage devices (e.g., storage devices 102, 104, 106, 108, 110, 112) and may be configured to be releasably electrically coupled to rack-mountable computing device 50. For example, storage device carrier system 100 may include linear array of mounting trays 114, wherein each mounting tray (e.g., mounting trays 116, 118, 120, 122, 124, 126) may be configured to removeably receive a storage device (e.g., storage devices 102, 104, 106, 108, 110, 112, respectively). As discussed above, examples of storage devices 102, 104, 106, 108, 110, 112 may include but are not limited to solid state storage devices and/or electro-mechanical storage devices.

Storage device carrier system 100 may further include velocity-increasing longitudinal cooling channel 128 that may be configured to provide cooling air 130 to linear array of mounting trays 114 (and storage devices 102, 104, 106, 108, 110, 112).

Velocity-increasing longitudinal cooling channel 128 may include beginning portion 132 and ending portion 134, wherein beginning portion 132 may be configured to receive cooling air 130. For example, beginning portion 132 may be positioned proximate a source of cooling air 130 (e.g., an air inlet or the pressure side of a cooling fan, not shown) and/or ending portion 134 may be positioned proximate an extraction point of cooling air 130 (e.g., an air exit or the suction side of a cooling fan, not shown).

Velocity-increasing longitudinal cooling channel 128 may be configured to increase the velocity of cooling air 130 as cooling air 130 moves along velocity-increasing longitudinal cooling channel 128 (e.g., from beginning portion 132 to ending portion 134). For example, beginning portion 132 may have a beginning cross-sectional area and ending portion 134 may have an ending cross-sectional area that is smaller than the beginning cross-sectional area. Accordingly, as a fixed volume of cooling area 130 moves through and along velocity-increasing longitudinal cooling channel 128 (e.g., from beginning portion 132 to ending portion 134), the velocity of cooling air 130 may increase due to the reduction of cross-sectional area as cooling air 130 moves from beginning portion 132 to ending portion 134.

Velocity-increasing longitudinal cooling channel 128 may include at least one intermediate portion that may be positioned between beginning portion 132 and ending portion 134, wherein the intermediate portion (or portions) may have a cross-sectional area (or areas) that are smaller than the beginning cross-sectional area (of beginning portion 132) but larger than the ending cross-sectional area (of ending portion 134). Again, due to the reduction of cross-sectional area as cooling air 130 moves from beginning portion 132 to ending portion 134 (via the intermediate portion(s)), the velocity of cooling air 130 may increase.

For example and in the embodiment shown in FIG. 3, velocity-increasing longitudinal cooling channel 128 may include four intermediate portions (for a total of six portions . . . one for each of storage devices 102, 104, 106, 108, 110, 112. Accordingly, these four intermediate portions may include: first intermediate portion 136 positioned proximate beginning portion 132; second intermediate portion 138 positioned proximate first intermediate portion 136; third intermediate portion 140 positioned proximate second intermediate portion 138; and fourth intermediate portion 142 positioned between third intermediate portion 140 and ending portion 134.

Storage device carrier system 100 may include cover assembly 144 that may be configured to releasably engage chassis assembly 146 of storage device carrier system 100, thus ensuring that cooling air 130 is contained within storage device carrier system 100 and travels the full length of velocity-increasing longitudinal cooling channel 128.

Referring also to FIG. 4, one example of velocity-increasing longitudinal cooling channel 128 may include stepped, velocity-increasing longitudinal cooling channel 128A. For example, stepped, velocity-increasing longitudinal cooling channel 128A may include one or more spacer assemblies (e.g., space assemblies 150, 152, 154, 156, 158, 160) configured to reduce the cross-sectional area of the portions (e.g., portions 132, 136, 138, 140, 142, 134, respectively) of stepped, velocity-increasing longitudinal cooling channel 128 as cooling air 130 moves from beginning portion 132 to ending portion 134 of stepped, velocity-increasing longitudinal cooling channel 128A, thus resulting in a corresponding increase in velocity of cooling air 130 within stepped, velocity-increasing longitudinal cooling channel 128A.

For example and in one specific implementation of stepped, velocity-increasing longitudinal cooling channel 128A:

spacer assembly 150 within beginning portion 132 of stepped, velocity-increasing longitudinal cooling channel 128A may be of sufficient thickness to result in beginning portion 132 of stepped, velocity-increasing longitudinal cooling channel 128A having a height of 13.1 millimeters;

spacer assembly 152 within intermediate portion 136 of stepped, velocity-increasing longitudinal cooling channel 128A may be of sufficient thickness to result in intermediate portion 136 of stepped, velocity-increasing longitudinal cooling channel 128A having a height of 9.1 millimeters, thus resulting in the velocity of cooling air 130 within intermediate portion 136 increasing by 43.95% (i.e., 13.1-9.1/9.1) with respect to beginning portion 132;

spacer assembly 154 within intermediate portion 138 of stepped, velocity-increasing longitudinal cooling channel 128A may be of sufficient thickness to result in intermediate portion 138 of stepped, velocity-increasing longitudinal cooling channel 128A having a height of 7.1 millimeters, thus resulting in the velocity of cooling air 130 within intermediate portion 138 increasing by 84.50% (i.e., 13.1-7.1/7.1) with respect to beginning portion 132;

spacer assembly 156 within intermediate portion 140 of stepped, velocity-increasing longitudinal cooling channel 128A may be of sufficient thickness to result in intermediate portion 140 of stepped, velocity-increasing longitudinal cooling channel 128A having a height of 5.1 millimeters, thus resulting in the velocity of cooling air 130 within intermediate portion 140 increasing by 156.86% (i.e., 13.1-5.1/5.1) with respect to beginning portion 132;

spacer assembly 158 within intermediate portion 142 of stepped, velocity-increasing longitudinal cooling channel 128A may be of sufficient thickness to result in intermediate portion 142 of stepped, velocity-increasing longitudinal cooling channel 128A having a height of 4.1 millimeters, thus resulting in the velocity of cooling air 130 within intermediate portion 142 increasing by 219.51% (i.e., 13.1-4.1/4.1) with respect to beginning portion 132; and spacer assembly 160 within ending portion 134 of stepped, velocity-increasing longitudinal cooling channel 128A may be of sufficient thickness to result in ending portion 134 of stepped, velocity-increasing longitudinal cooling channel 128A having a height of 3.1 millimeters, thus resulting in the velocity of cooling air 130 within ending portion 134 increasing by 322.58% (i.e., 13.1-3.1/3.1) with respect to beginning portion 132.

Referring also to FIG. 5, one example of velocity-increasing longitudinal cooling channel 128 may include sloped, velocity-increasing longitudinal cooling channel 128B having at least one sloped surface configured to reduce the cross-sectional area of the portions (e.g., portions 132, 136, 138, 140, 142, 134) of sloped, velocity-increasing longitudinal cooling channel 128B as cooling air 130 moves from beginning portion 132 to ending portion 134 of sloped, velocity-increasing longitudinal cooling channel 128B, thus resulting in a corresponding increase in velocity of cooling air 130 within sloped, velocity-increasing longitudinal cooling channel 128B. Specifically, sloped, velocity-increasing longitudinal cooling channel 128B may include one or more spacer assemblies (e.g., spacer assemblies 200, 202, 204, 206, 208, 210) that each include a sloped upper surface (as shown in FIG. 5), thus resulting in a gradual reduction of cross-sectional area (as opposed to the stepped reduction in cross-sectional area that occurs in stepped, velocity-increasing longitudinal cooling channel 128A).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A storage device carrier system comprising: a linear array of mounting trays positioned substantially at the same height, wherein each mounting tray is configured to removeably receive a storage device; and a velocity-increasing longitudinal cooling channel configured to provide cooling air to the linear array of mounting trays, wherein the velocity-increasing longitudinal cooling channel includes a plurality of spacer assemblies configured to reduce a cross-sectional area of the velocity-increasing longitudinal cooling channel, wherein a spacer assembly of the plurality of spacer assemblies is positioned underneath each mounting tray in the linear array of mounting trays, wherein each spacer assembly of the plurality of spacer assemblies has a height greater than the height of a previous spacer assembly and further reduces the cross-sectional area of the velocity-increasing longitudinal cooling channel.

2. The storage device carrier system of claim 1 wherein the velocity-increasing longitudinal cooling channel includes a beginning portion and an ending portion.

3. The storage device carrier system of claim 2 wherein the beginning portion is configured to receive the cooling air.

4. The storage device carrier system of claim 2 wherein the beginning portion has a beginning cross-sectional area and the ending portion has an ending cross-sectional area that is smaller than the beginning cross-sectional area.

5. The storage device carrier system of claim 4 wherein the velocity-increasing longitudinal cooling channel includes:
at least one intermediate portion that is positioned between the beginning portion and the ending portion.

6. The storage device carrier system of claim 5 wherein the at least one intermediate portion has a cross-sectional area that is smaller than the beginning cross-sectional area but larger than the ending cross-sectional area.

7. The storage device carrier system of claim 5 wherein the at least one intermediate portion includes four intermediate portions.

8. The storage device carrier system of claim 7 wherein the four intermediate portions include:

a first intermediate portion positioned proximate the beginning portion;
a second intermediate portion positioned proximate the first intermediate portion;
a third intermediate portion positioned proximate the second intermediate portion; and
a fourth intermediate portion positioned between the third intermediate portion and the ending portion.

9. The storage device carrier system of claim 4 wherein the velocity-increasing longitudinal cooling channel is a stepped, velocity-increasing longitudinal cooling channel.

10. The storage device carrier system of claim 9 wherein the plurality of spacer assemblies are configured to reduce the cross-sectional area of the portions of the stepped, velocity-increasing longitudinal cooling channel as the cooling air moves from the beginning portion to the ending portion of the stepped, velocity-increasing longitudinal cooling channel.

11. The storage device carrier system of claim 4 wherein the velocity-increasing longitudinal cooling channel is a sloped, velocity-increasing longitudinal cooling channel.

12. The storage device carrier system of claim 11 wherein the sloped, velocity-increasing longitudinal cooling channel includes:
at least one sloped surface configured to reduce the cross-sectional area of the portions of the sloped, velocity-increasing longitudinal cooling channel as the cooling air moves from the beginning portion to the ending portion of the sloped, velocity-increasing longitudinal cooling channel.

13. The storage device carrier system of claim 1 wherein the storage device is a solid state storage device.

14. The storage device carrier system of claim 1 wherein the storage device is an electro-mechanical storage device.

15. A storage device carrier system comprising: a linear array of mounting trays positioned substantially at the same height, wherein each mounting tray is configured to removeably receive a storage device; and a velocity-increasing longitudinal cooling channel configured to provide cooling air to the linear array of mounting trays and including a beginning portion and an ending portion, wherein: the beginning portion has a beginning cross-sectional area and is configured to receive the cooling air, and the ending portion has an ending cross-sectional area that is smaller than the beginning cross-sectional area; wherein the velocity-increasing longitudinal cooling channel includes a plurality of spacer assemblies configured to reduce a cross-sectional area of the velocity-increasing longitudinal cooling channel, wherein a spacer assembly of the plurality of spacer assemblies is positioned underneath each mounting tray in the linear array of mounting trays, wherein each spacer assembly of the plurality of spacer assemblies has a height greater than the height of a previous spacer assembly and further reduces the cross-sectional area of the velocity-increasing longitudinal cooling channel.

16. The storage device carrier system of claim 15 wherein the velocity-increasing longitudinal cooling channel includes:
at least one intermediate portion that is positioned between the beginning portion and the ending portion.

17. The storage device carrier system of claim 16 wherein the at least one intermediate portion has a cross-sectional area that is smaller than the beginning cross-sectional area but larger than the ending cross-sectional area.

18. A storage device carrier system comprising: a linear array of mounting trays positioned substantially at the same height, wherein each mounting tray is configured to removeably receive a storage device; and a stepped, velocity-increasing longitudinal cooling channel configured to provide cooling air to the linear array of mounting trays and including: a beginning portion having a beginning cross-sectional area and configured to receive the cooling air, an ending portion having an ending cross-sectional area that is smaller than the beginning cross-sectional area, and a plurality of spacer assemblies configured to reduce the cross-sectional area of the portions of the stepped, velocity-increasing longitudinal cooling channel as the cooling air moves from the beginning portion to the ending portion of the stepped, velocity-increasing longitudinal cooling channel, wherein a spacer assembly of the plurality of spacer assemblies is positioned underneath each mounting tray in the linear array of mounting trays, wherein each spacer assembly of the plurality of spacer assemblies has a height greater than the height of a previous spacer assembly and further reduces the cross-sectional area of the velocity-increasing longitudinal cooling channel.

19. The storage device carrier system of claim 18 wherein the velocity-increasing longitudinal cooling channel includes:

at least one intermediate portion that is positioned between the beginning portion and the ending portion.

20. The storage device carrier system of claim 19 wherein the at least one intermediate portion has a cross-sectional area that is smaller than the beginning cross-sectional area but larger than the ending cross-sectional area.

\* \* \* \* \*